United States Patent [19]

Lee

[11] Patent Number: 5,012,243
[45] Date of Patent: Apr. 30, 1991

[54] SUPERCONDUCTING ANALOG-TO-DIGITAL CONVERTER WITH FLOATING FOUR-JUNCTION SQUID BIDIRECTIONAL COUNTER

[75] Inventor: Gregory S. Lee, Los Angeles, Calif.

[73] Assignee: TRW Inc., Redondo Beach, Calif.

[21] Appl. No.: 397,932

[22] Filed: Aug. 24, 1989

[51] Int. Cl.$^5$ .................. H03M 1/00; H03M 1/20; H03K 3/00
[52] U.S. Cl. .................. 341/133; 307/277; 307/476; 341/171; 505/827
[58] Field of Search ............... 341/131, 133, 171; 307/476; 505/827

[56] References Cited

U.S. PATENT DOCUMENTS

| | | | |
|---|---|---|---|
| 3,196,427 | 7/1965 | Mann et al. | 340/347 |
| 3,263,097 | 7/1966 | Noble | 307/88.5 |
| 3,327,303 | 6/1967 | Hughes et al. | 340/347 |
| 3,458,735 | 7/1969 | Fiske | 307/306 |
| 3,621,472 | 11/1971 | Rothwarf | 332/20 |
| 3,949,395 | 4/1976 | Klein | 340/347 AD |
| 3,978,351 | 8/1976 | Zappe | 307/306 |
| 3,983,419 | 9/1976 | Fang | 307/277 |
| 4,117,354 | 9/1978 | Gheewala | 307/306 |
| 4,136,290 | 1/1979 | Davidson et al. | 307/277 |
| 4,149,097 | 4/1979 | Faris | 307/212 |
| 4,315,255 | 2/1982 | Harris et al. | 340/347 AD |
| 4,371,796 | 2/1983 | Takada | 307/476 |
| 4,373,138 | 2/1983 | Fulton et al. | 307/277 |
| 4,401,900 | 8/1983 | Faris | 307/352 |
| 4,413,197 | 11/1983 | Josephs et al. | 307/462 |
| 4,423,430 | 12/1983 | Hasuo et al. | 357/5 |
| 4,470,023 | 9/1984 | Lukens et al. | 331/107 S |
| 4,470,090 | 9/1984 | Carr, Jr. | 361/19 |
| 4,501,975 | 2/1985 | Josephs et al. | 307/277 |
| 4,509,018 | 4/1985 | Gershenson | 330/61 R |
| 4,533,840 | 8/1985 | Gheewala et al. | 306/306 |
| 4,567,383 | 1/1986 | Goto et al. | 307/415 |
| 4,623,804 | 11/1986 | Goto | 307/476 |
| 4,631,423 | 12/1986 | Faris | 307/352 |
| 4,646,060 | 2/1987 | Phillips et al. | 340/347 AD |
| 4,672,359 | 6/1987 | Silver | 340/347 AD |
| 4,710,651 | 12/1987 | Suzuki | 307/462 |
| 4,713,562 | 12/1987 | Hasuo et al. | 307/462 |

*Primary Examiner*—William M. Shoop, Jr.
*Assistant Examiner*—Helen Kim
*Attorney, Agent, or Firm*—James M. Steinberger; Sol L. Goldstein

[57] ABSTRACT

A high-speed, high-resolution superconducting counting A/D converter providing greatly increased conversion speeds with a low device count. The superconducting counting A/D converter includes includes a double-junction SQUID quantizer and a bidirectional binary counter having n stages of floating four-junction SQUID flip-flops, where n is the number of bits of accuracy of the counter. The quantizer continuously tracks an analog signal, generating up-count and down-count voltage pulses of the same polarity on two different output lines for increasing and decreasing values of the analog current, respectively. The bidirectional binary counter algebraically counts the voltage pulses, increasing the binary count when up-count pulses are received and decreasing the binary count when down-count pulses are received. Several techniques for reading the contents of the bidirectional binary counter at the end of each sampling interval are also disclosed.

24 Claims, 4 Drawing Sheets

SUPERCONDUCTING ANALOG-TO-DIGITAL CONVERTER WITH FLOATING FOUR-JUNCTION SQUID BIDIRECTIONAL COUNTER

This application is related to a co-filed application by the same inventor having Ser. No. 07/397923 and entitled "Superconducting Analog-To-Digital Converter With Grounded Four-Junction Squid Bidirectional Counter."

BACKGROUND OF THE INVENTION

This invention relates generally to analog-to-digital converters and, more particularly, to high-speed, high-resolution analog-to-digital converters employing superconducting Josephson junctions.

High-performance analog-to-digital (A/D) converters are required in a variety of commercial and military electronic devices. Two of the more important measures of an A/D converter's performance are its speed, as measured by the number of samples converted per second, and resolution, as measured by the smallest increment of change that can be detected in an analog signal. Superconducting technology is particularly well suited to performing high-speed, high-resolution A/D conversion because Josephson junctions, which are the basic switching elements utilized in superconducting electronic devices, possess a unique combination of speed, sensitivity, and periodic response characteristics.

The Josephson junction is a simple bistable switching device having a very thin insulating layer sandwiched between two superconducting electrodes. When current supplied to the Josephson junction is increased above the critical current of the junction, the device is switched from a superconducting zero-voltage state to a resistive voltage state. The resistive voltage state, in which the voltage drop across the device is equal to the energy gap of the superconductor material, is switched off by reducing the current supplied to the junction to about zero. Because this switching operation can occur in as little as a few picoseconds, the Josephson junction is truly a high speed switching device. In a superconducting A/D converter, one or more of the Josephson junctions are combined with one or more inductive loads to form a logic circuit called a SQUID, or Superconducting Quantum Interference Device.

The characteristics of the SQUID that provide the basis for superconducting A/D conversion can best be explained with reference to a single-junction SQUID. The single-junction SQUID, which is simply a Josephson junction connected across an inductance to form a superconducting loop, exhibits a periodic and multi-valued relationship between the current injected into the inductance and the magnetic flux in the loop. The magnetic flux in the loop increases by a small quantum whenever the current increases by a small and precisely repeatable increment. This quantum of flux gives rise to a small but measurable voltage pulse across the junction. When the current is decreased by a like increment, the magnetic flux in the loop decreases by the small quantum, and a corresponding voltage pulse of the opposite polarity is produced across the junction.

In order to convert a signal from analog to digital form using the single-junction SQUID, the analog signal is introduced into the SQUID as a varying current. Each time the current increases or decreases by a predetermined amount, a measurable voltage pulse is generated across the junction. In this manner, the SQUID functions as a quantizer, with the resultant pulses being detected and counted in one or more binary counters. The principle advantages of this superconducting counting A/D converter are its near perfect linearity and its high sensitivity and speed. The current increment or decrement, which determines the resolution of the device, can be made extremely small. This is because a single flux quantum is only $2.07 \times 10^{-15}$ weber and the current increment or decrement is the flux quantum divided by the value of the inductance (measured in henries).

U.S. Pat. No. 4,646,060 to Phillips et al. discloses a superconducting counting A/D converter having a double-junction SQUID quantizer and a bidirectional binary counter comprised of n stages of double-junction SQUID flip-flops, where n is the number of bits of accuracy of the counter. The quantizer generates up-count and down-count voltage pulses of the same polarity on two different output lines, rather than voltage pulses of the opposite polarity on the same output line, as in the single-junction SQUID. The bidirectional binary counter algebraically counts the voltage pulses, increasing the binary count when up-count pulses are received and decreasing the binary count when down-count pulses are received. Superconducting logic circuitry, which includes numerous AND and OR gates, provides the carry and borrow functions of the counter.

Although the Phillips et al. A/D converter has certain advantages, it also has several disadvantages. One disadvantage is that the additional logic circuitry reduces the speed and increases the device count of the A/D converter. An increased device count reduces the reliability of the A/D converter and also increases its cost. Accordingly, there has been a need for a superconducting analog-to-digital converter that does not require this additional logic circuitry. The present invention fulfills this need.

SUMMARY OF THE INVENTION

The present invention resides in a high-speed, high-resolution superconducting counting A/D converter providing greatly increased conversion speeds with a low device count The superconducting counting A/D converter includes a double-junction SQUID quantizer and a bidirectional binary counter having n stages of floating four-junction SQUID flip-flops, where n is the number of bits of accuracy of the counter. The quantizer continuously tracks an analog signal, generating up-count and down-count voltage pulses of the same polarity on two different output lines for increasing and decreasing values of the analog current, respectively. The bidirectional binary counter algebraically counts the voltage pulses, increasing the binary count when up-count pulses are received and decreasing the binary count when down-count pulses are received.

The quantizer includes two Josephson junctions and a center-tapped inductance connected together to form a superconducting loop A constant gate current is injected into the center-tap terminal of the inductance, while the analog signal is transformer-coupled through a winding to the inductance. The bidirectional binary counter includes n stages of the floating four-junction SQUID flip-flops connected together in a cascade arrangement from the least significant bit (LSB) to the most significant bit (MSB) Each floating four-junction SQUID flip-flop includes four Josephson junctions and two center-tapped inductances connected together to form a superconducting loop.

The four-junction SQUID flip-flop is a bistable logic circuit in which the direction of the circulating current determines the state of the circuit. A "0" bit is represented by a counterclockwise circulating supercurrent and a "1" bit is represented by a clockwise circulating supercurrent. When an up-count or down-count pulse is applied to the SQUID flip-flop, the current through one of the Josephson junctions is raised momentarily above the critical current of the junction. This causes the Josephson junction to generate a voltage pulse, thereby reversing the direction of the circulating current. Subsequent pulses applied to the SQUID flip-flop cause the flip-flop to toggle or reverse state. In this manner, an up-count pulse will ripple from flip-flop to flip-flop, changing the binary state of each stage and generating a carry pulse if the initial state of the stage is a "1". A down-count pulse will also ripple from flip-flop to flip-flop, changing the binary state of each stage and generating a borrow pulse if the initial state of the stage is a "0".

In an alternative embodiment of the high-speed, high-resolution superconducting counting A/D converter of the present invention, the quantizer is a single-junction SQUID quantizer. The single-junction quantizer generates up-count and down-count voltage pulses of the opposite polarity on a single output line for positive and negative values of an analog voltage, respectively. The quantizer digitizes an analog voltage, rather than an analog current, using the alternating current effect of Josephson junctions. When a voltage is applied to a Josephson junction, an alternating current is generated across the junction. Because the frequency of the current is dependent on the magnitude of the voltage, the average voltage during the sampling interval can be digitized by counting the frequency of the alternating current over that time interval.

The high-speed, high-resolution superconducting counting A/D converter of the present invention also includes means for reading the contents of the counter at the end of each sampling interval. One technique for reading the contents of the counter is to utilize a toggling quantizer and two bidirectional binary counters. The quantizer toggles between the two counters at the end of each sampling interval so that one counter can be read while the other counter is counting, and vice versa. An adder combines the outputs of the two counters. Another technique for reading the contents of the binary counter is to utilize a variable-hysteresis quantizer. The variable-hysteresis quantizer inhibits the generation of voltage pulses during the read period, allowing the counter to be read without missing any changes in the analog signal.

The A/D converter of the present invention has many advantages, including very fast A/D conversion speeds and a low device count. These advantages result from the ability of the four-junction SQUID flip-flops to control both the binary states of the stages of the counter and the bidirectional transitions and propagations of the counter. The gates that would normally process this logic cannot operate at the required speeds. Therefore, eliminating the logic gates results in an extremely fast counter which can count up or down at speeds greater than 1 count every 10 picoseconds, or a counting rate of 100 GHz. Eliminating the logic gates also reduces the device count, which greatly enhances reliability and reduces power consumption and cost.

It will be appreciated from the foregoing that the present invention represents a significant advance in the field of superconducting analog-to-digital converters. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENTS

Figure 2:
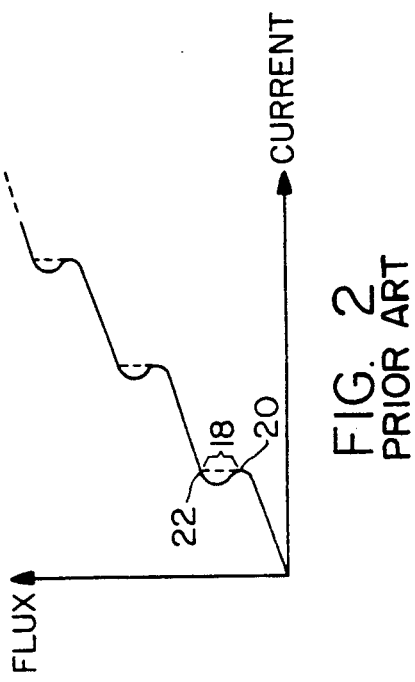
FIG. 2 is a graph of the magnetic flux as a function of injected current for the single-junction SQUID.
Figure 1:
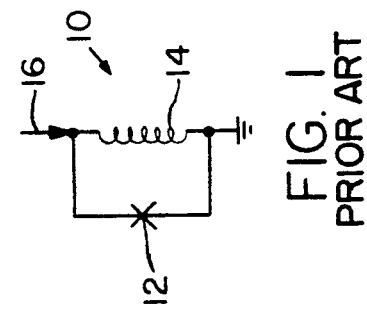
FIG. 1 is a circuit diagram of a single-junction SQUID device.

FIG. 1 illustrates a single-junction SQUID 10 in which a Josephson junction 12 is connected across an inductance 14 to form a superconducting loop. One terminal of the inductance 14 is connected to a current source, indicated at 16, and the other terminal is connected to ground. FIG. 2 is a simplified representation of the relationship between the injected current and the magnetic flux in the loop. As the current increases, the magnetic flux also increases, until a multi-valued region of the curve is reached, as indicated at 18. When a current-reversal point 20 is reached, a further increase in the current causes the magnetic flux to jump to a higher level of the multi-valued region, as indicated at 22. This sudden flux increment results in a small but measurable voltage pulse across the Josephson junction 12.

The curve of FIG. 2 is perfectly periodic in that the current increments between successive peaks in the curve are uniform, as are the magnetic flux increments that are generated as a result of the current increments. When the current through the circuit falls, the magnetic flux in the loop is reduced, and corresponding voltage pulses of the opposite polarity are generated across the Josephson junction 12. These characteristics of the SQUID are the basis for A/D conversion using superconducting devices.

Figure 3:
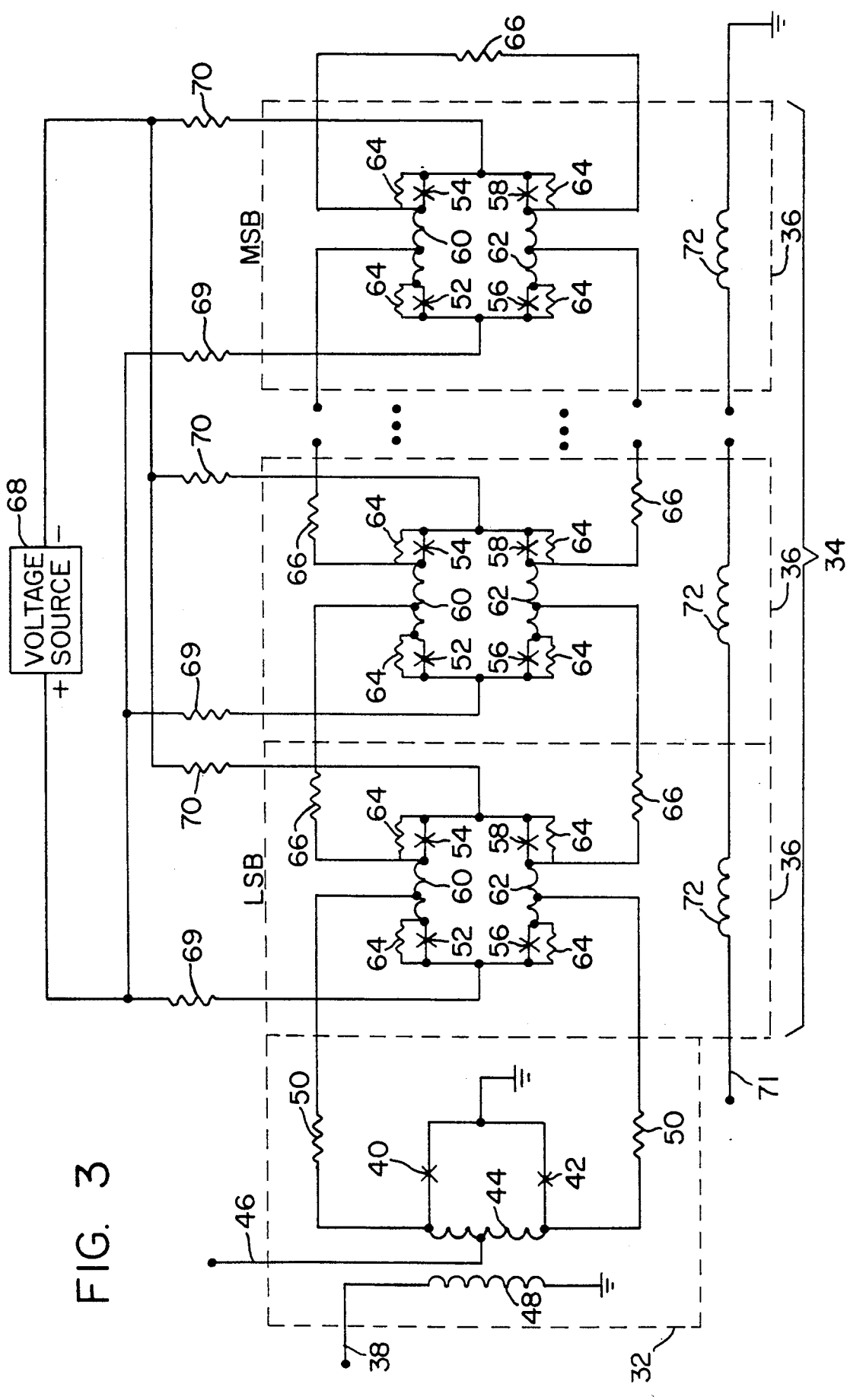
FIG. 3 is a circuit diagram of a high-speed, high resolution superconducting A/D converter according to the present invention.

FIG. 3 illustrates a high-speed, high-resolution superconducting counting A/D converter according to the present invention. The superconducting counting A/D converter includes a double-junction SQUID quantizer 32 and a bidirectional binary counter 34 having n stages of floating four-junction SQUID flip-flops 36, where n is the number of bits of accuracy of the counter. The quantizer 32 continuously tracks an analog signal, on line 38, generating up-count and down-count voltage pulses of the same polarity on two different output lines for increasing and decreasing values of the analog current, respectively. The bidirectional binary counter 34 algebraically counts the voltage pulses, increasing the binary count when up-count pulses are received and decreasing the binary count when down-count pulses are received.

The quantizer 32 includes two Josephson junctions 40, 42 and a center-tapped inductance 44 connected together to form a superconducting loop. One terminal of each of the Josephson junctions 40, 42 is connected to a different end terminal of the inductance 44 and the other terminal of each of the Josephson junctions 40, 42 is connected to ground. A constant gate current, on line 46, is injected into the center-tap terminal of the inductance 44. The analog signal on line 38 is transformer-coupled through a winding 48 to the inductance 44. Alternatively, the analog signal on line 38 may be directly coupled into the inductance 44. Positive incremental changes in the analog current result in the generation of up-count voltage pulses across Josephson junction 40 and negative incremental changes in the analog current result in the generation of down-count voltage pulses across Josephson junction 42. These up-count and down-count signals are output to the binary counter 34 from the terminals between the inductance 44 and the Josephson junctions 40, 42, respectively, and are each applied to the counter through a resistor 50.

The bidirectional binary counter 34 includes n stages of the floating four-junction SQUID flip-flops 36 connected together in a cascade arrangement from the least significant bit (LSB) to the most significant bit (MSB). Each floating four-junction SQUID flip-flop 36 includes four Josephson junctions 52, 54, 56, 58 and two center-tapped inductances 60, 62 connected together to form a superconducting loop. One terminal of each of the Josephson junctions 52, 54 is connected to a different end terminal of inductance 60 and one terminal of each of the Josephson junctions 56, 58 is connected to a different end terminal of inductance 62. The other terminals of Josephson junctions 52, 56 are connected together and the other terminals of Josephson junctions 54, 58 are connected together. Each of the Josephson junctions 52, 54, 56, 58 also has a shunt resistor 64 connected across its terminals.

The center-tap terminal of inductance 60 receives the carry signal from the preceding four-junction SQUID flip-flop 36, or the up-count signal from the quantizer 32 if the four-junction SQUID flip-flop is the LSB flip-flop, and the center-tap terminal of inductance 62 receives the down-count or borrow signal. The carry and borrow signals are output to the succeeding four-junction SQUID flip-flop 36 from the terminal between Josephson junction 54 and inductance 60 and from the terminal between Josephson junction 58 and inductance 62, respectively, and are each applied to the succeeding SQUID flip-flop through a resistor 66.

A constant gate current is supplied to each four-junction SQUID flip-flop 36 by applying an ungrounded constant voltage source 68 to resistors 69. The constant gate current flows through each SQUID flip-flop from the terminal between Josephson junctions 52, 56 to the terminal between Josephson junctions 54, 58, where it is returned to the constant voltage source 68 through resistors 70. Because the voltage source 68 and the four-junction SQUID flip-flops 36 are ungrounded, the SQUID flip-flops operate in a floating mode. This allows all four Josephson junctions to be identical, providing a symmetrical SQUID flip-flop. A flux bias of $\Phi_0/2$, where $\Phi_0$ is a flux quantum $h/2\overline{3} = 2.07 \times 10^{-15}$ weber, is generated in each SQUID flip-flop by a flux bias line 71 and inductances 72. Alternatively, the flux bias can be applied to the SQUID flip-flops by individual flux bias lines rather than by the single flux bias line 71. The flux bias induces a flux bias current in each SQUID flip-flop. The Josephson junctions 52, 54, 56, 58 are resistively shunted so that the SQUID flip-flops 36 operate in a nonlatching mode, which allows the SQUID flip-flops to operate at much faster speeds than when operated in a latching mode.

Each four-junction SQUID flip-flop 36 is a bistable logic circuit in which the direction of the circulating current determines the state of the circuit. A "0" bit is represented by a counterclockwise circulating supercurrent and a "1" bit is represented by a clockwise circulating supercurrent. When an up-count/carry pulse or a down-count/borrow pulse is applied to the SQUID flip-flop, the current through one of the Josephson junctions is raised momentarily above the critical current of the junction. This causes the Josephson junction to generate a voltage pulse, thereby reversing the direction of the circulating current. Subsequent pulses applied to the SQUID flip-flop cause the flip-flop to toggle or reverse state. In this manner, an up-count or carry signal will ripple from flip-flop to flip-flop, changing the binary state of each stage and generating a further carry signal if the initial state of the stage is a "1". A down-count or borrow signal will also ripple from flip-flop to flip-flop, changing the binary state of each stage and generating a further borrow signal if the initial state of the stage is a "0".

There are four possible transitions for each of the SQUID flip-flops 36, from a "0" up to a "1", from a "0" down to a "1", from a "1" up to a "0", and from a "1" down to a "0". When a SQUID flip-flop is indicating a "0", an up-count or carry signal causes Josephson junction 56 to pulse, while a down-count or borrow signal causes Josephson junction 58 to pulse and output a borrow signal to the succeeding SQUID flip-flop. When a SQUID flip-flop is indicating a "1", an up-count or carry signal causes Josephson junction 54 to pulse and output a carry signal to the succeeding SQUID flip-flop, while a down-count or borrow signal causes Josephson junction 52 to pulse. Accordingly, Josephson junction 54 is the add-with-carry junction, Josephson junction 56 is the add-without-carry junction, Josephson junction 58 is the subtract-with-borrow junction, and Josephson junction 52 is the subtract-without-borrow junction.

Looking at each of the transitions in more detail, when a bit is indicating a "0", the flux bias current and the gate current combine positively in Josephson junctions 56, 58 and negatively in Josephson junctions 52, 54. Accordingly, Josephson junctions 56 and 58 support relatively large current flows which will allow them to pulse due to a carry or borrow signal. An up-count or carry signal supplies current to the loop which combines positively with the current through Josephson junction 56 and negatively with the current through Josephson junction 58. Therefore, the current through Josephson junction 56 will exceed its critical current, causing the junction to generate a voltage pulse. The circulation state of the SQUID flip-flop will change to a clockwise direction, indicating a "1", and no carry or borrow signal will be propagated to the next bit.

A down-count or borrow signal supplies current to the loop which combines positively with the current through Josephson junction 58 and negatively with the current through Josephson junction 56. Therefore, the current through Josephson junction 58 will exceed its critical current, causing the junction to generate a voltage pulse. The circulation state of the SQUID flip-flop will change to a clockwise direction, and a borrow signal will be propagated to the next bit.

When a bit is indicating a "1", the flux bias current and the gate current combine positively in Josephson junctions 52, 54 and negatively in Josephson junctions 56, 58. Accordingly, Josephson junctions 52 and 54 support relatively large current flows which will allow them to pulse due to a carry or borrow signal. An up-count or carry signal supplies current to the loop which combines positively with the current through Josephson junction 54 and negatively with the current through Josephson junction 52. Therefore, the current through Josephson junction 54 will exceed its critical current, causing the junction to generate a voltage pulse. The circulation state of the SQUID flip-flop will change to a counterclockwise direction, indicating a "0", and a carry signal will be propagated to the next bit.

A down-count or borrow signal supplies current to the loop which combines positively with the current through Josephson junction 52 and negatively with the current through Josephson junction 54. Therefore, the current through Josephson junction 52 will exceed its critical current, causing the junction to generate a voltage pulse. The circulation state of the SQUID flip-flop will change to a counterclockwise direction, and no carry or borrow signal will be propagated to the next bit.

Figure 4:
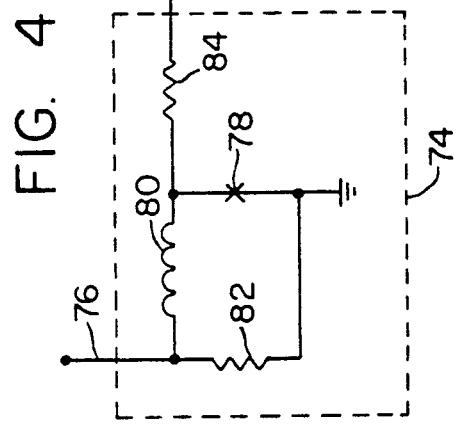
FIG. 4 is a circuit diagram of a single-junction SQUID quantizer.

In an alternative embodiment of the high-speed, high-resolution superconducting counting A/D converter of the present invention, the quantizer is a single-junction SQUID quantizer 74, as illustrated in FIG. 4. The single-junction quantizer 74 generates up-count and down-count voltage pulses of the opposite polarity on a single output line for positive and negative values of an analog voltage, on line 76. In the LSB SQUID flip-flop 36 of the bidirectional binary counter 34, the single output line of the quantizer 74 is applied to the center-tap terminal of inductance 60, while the center-tap terminal of inductance 62 is grounded.

The single-junction quantizer 74 includes a Josephson junction 78, an inductance 80 and a resistor 82 connected together to form a superconducting loop. One terminal of the inductance 80 is connected to a terminal of the Josephson junction 78, the other terminal of the inductance 80 is connected to a terminal of the resistor 82 and the other terminal of the resistor 82 is connected to the other terminal of the Josephson junction 78. The terminal between the Josephson junction 78 and the resistor 82 is grounded and the terminal between the inductance 80 and the resistor 82 receives the analog signal. The up-count/down-count signal is output to the binary counter from the terminal between the inductance 80 and the Josephson junction 78 and is applied to the counter through a resistor 84.

The single-junction SQUID quantizer 74 digitizes an analog voltage, rather than an analog current, using the alternating current effect of Josephson junctions. When a voltage is applied to a Josephson junction, an alternating current is generated across the junction. Because the frequency of the current is dependent on the magnitude of the voltage, the average voltage during the sampling interval can be digitized by counting the frequency of the alternating current over that time interval.

Figure 5:
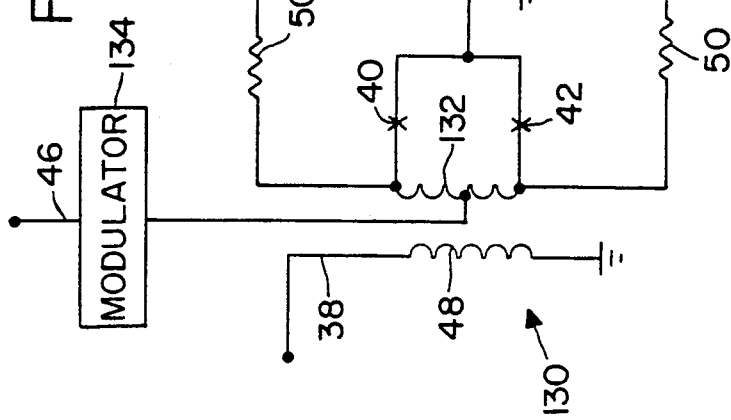
FIG. 5 is a circuit diagram of a toggling quantizer and two bidirectional counters.

The high-speed, high-resolution superconducting counting A/D converter of the present invention also includes means for reading the contents of the counter at the end of each sampling interval. One technique for reading the contents of the counter is to utilize a toggling quantizer 120 and two bidirectional binary counters 34, as illustrated in FIG. 5. The quantizer 120 toggles between the two counters at the end of each sampling interval so that counter A can be read while counter B is counting, and vice versa. An adder (not shown) combines the outputs of the two counters.

The toggling quantizer 120 includes the four Josephson junctions 52, 54, 56, 58 and the two inductances 60, 62 of the four-junction SQUID flip-flop 36, and first and second resistors 122. One terminal of the first resistor 122 is connected to the center-tap terminal of inductance 60, one terminal of the second resistor 122 is connected to the center-tap terminal of inductance 62 and the other terminals of the resistors 122 are connected together. An analog signal, on line 124, is transformer-coupled through windings 126 to the inductances 60, 62. A constant gate current, on line 128, is injected into the quantizer at the terminal between the two resistors 122.

Figure 6:
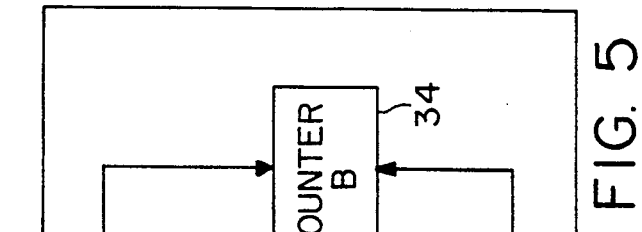
FIG. 6 is a diagram of the current flowing through the toggling quantizer as a function of time.

Counter A is selected for counting by grounding the terminal between Josephson junctions 52, 56 and counter B is selected for counting by grounding the terminal between Josephson junctions 54, 58. The gate current flows through the two Josephson junctions having the grounded terminal, which allows the two Josephson junctions to be switched by the analog current. A diagram of the gate current flowing through the quantizer as a function of time is illustrated in FIG. 6. No information can be lost during the toggling because at the crossover points, when the currents A and B are equal, one counter or the other will receive the pulses.

When counter A is selected, positive incremental changes in the analog current result in the generation of up-count voltage pulses across Josephson junction 52 and negative incremental changes result in the generation of down-count voltage pulses across Josephson junction 56. When counter B is selected, positive incremental changes in the analog current result in the generation of up-count voltage pulses across Josephson junction 54 and negative incremental changes result in the generation of down-count voltage pulses across Josephson junction 58. The up-count signal is output to counter A from the terminal between inductance 60 and Josephson junction 52 and to counter B from the terminal between inductance 60 and Josephson junction 54. The down-count signal is output to counter A from the terminal between inductance 62 and Josephson junction 56 and to counter B from the terminal between inductance 62 and Josephson junction 58.

Figure 7:
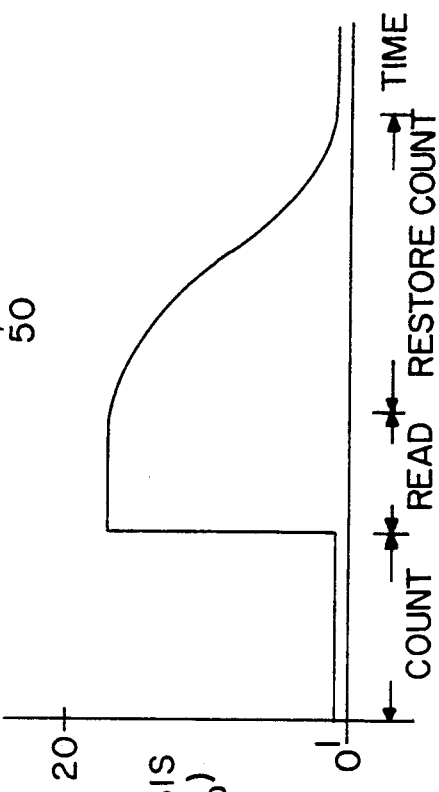
FIG. 7 is a circuit diagram of a variable-hysteresis quantizer.

Another technique for reading the contents of the binary counter 34 is to utilize a variable-hysteresis quantizer 130, as illustrated in FIG. 7. The variable-hysteresis quantizer 130 inhibits the generation of voltage pulses during the read period, allowing the counter to be read without missing any changes in the analog signal. The variable-hysteresis quantizer 130 includes the two Josephson junctions 40, 42 of the double-junction SQUID quantizer 32 and a center-tapped inductance 132. One terminal of each of the Josephson junctions 40, 42 is connected to a different end terminal of the inductance 132 and the other terminal of each of the Josephson junctions 40, 42 is connected to ground. The constant gate current on line 46 is modulated by modulator 134, with the modulated gate current being injected into the center-tap terminal of the inductance 132. The analog signal on line 38 is transformer-coupled through winding 48 to the inductance 132.

The inductance 132 is large so that the quantizer 130 has a $\beta_L > > \pi$, where $\beta_L$ is defined as $2\pi LI_c/\Phi_0$ and L is the inductance of the quantizer 130, $I_c$ is the critical current of the Josephson junctions 40, 42 and $\Phi_0$ is the flux quantum. The hysteresis of the quantizer 130 is controlled by the modulated gate current, with a small gate current producing a large hysteresis and a large gate current producing a small hysteresis.

Figure 8:
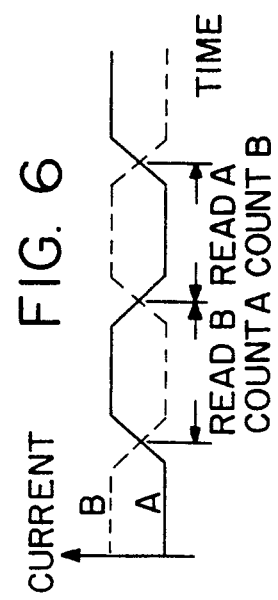
FIG. 8 is a diagram of the hysteresis of the variable-hysteresis quantizer as a function of time.
Figure 9:
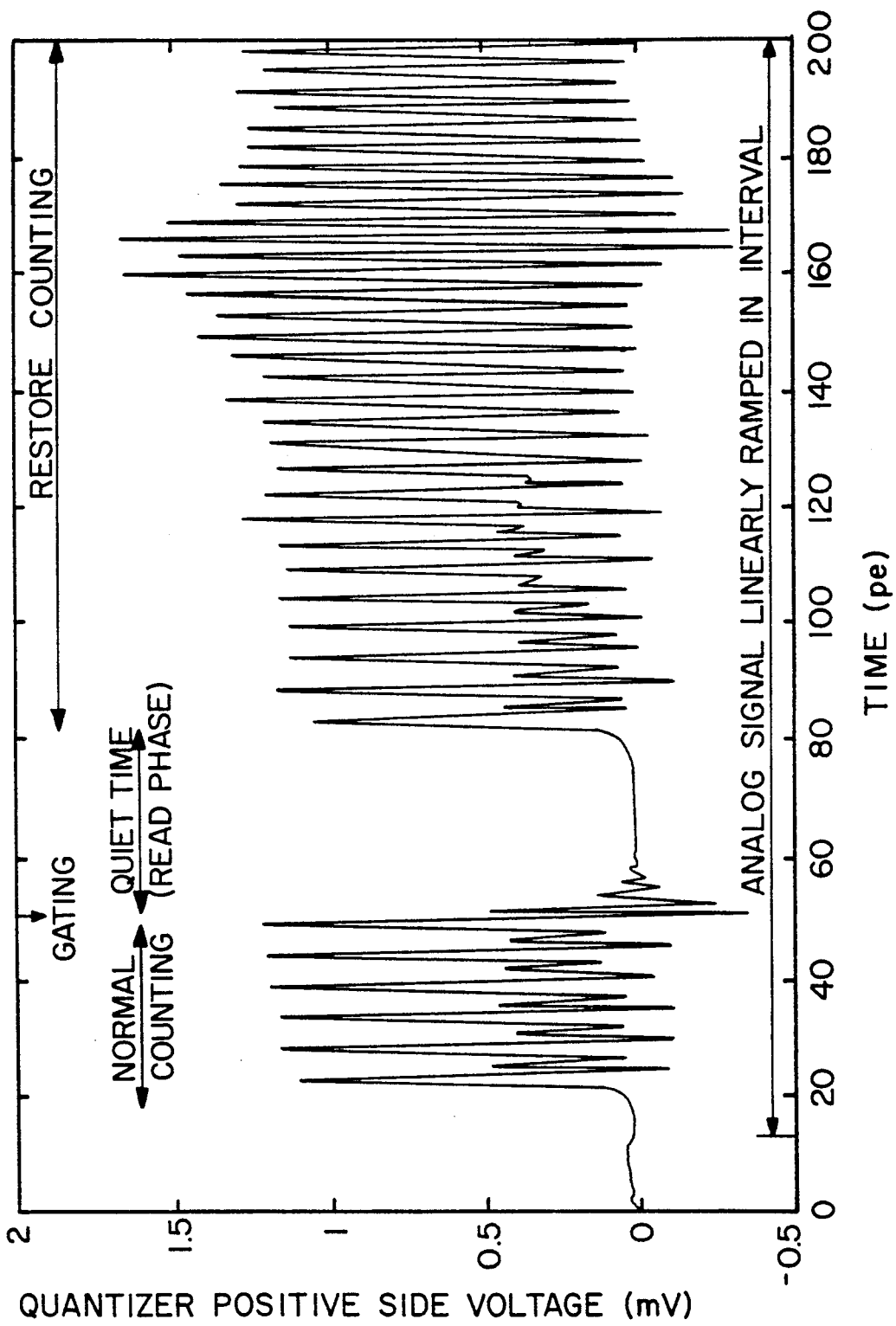
FIG. 9 is a diagram of the voltage pulses generated by the variable-hysteresis quantizer as a function of time.

As shown in FIGS. 8 and 9, during the sampling interval, a small hysteresis allows the quantizer to output up-count and down-count signals to the bidirectional binary counter 34. At the end of the sampling interval, the hysteresis is rapidly increased to inhibit the generation of any additional voltage pulses. During this read period, the bits of the counter are read sequentially starting with the LSB. Any changes in the analog signal during the read period are stored in the quantizer loop as magnetic flux. The hysteresis of the quantizer is then decreased, which allows the generation of voltage pulses to be resumed. By slowly decreasing the hysteresis, the output pulse train from the quantizer is slightly compressed, as shown in FIG. 9. This allows the quantizer to output new pulses and also recover the pulses that were stored in the quantizer during the read period.

The A/D converter of the present invention has many advantages, including very fast A/D conversion speeds and a low device count. These advantages result from the ability of the four-junction SQUID flip-flops to control both the binary states of the stages of the counter and the bidirectional transitions and propagations of the counter. The gates that would normally process this logic cannot operate at the required speeds. Therefore, eliminating the logic gates results in an extremely fast counter which can count up or down at speeds greater than 1 count every 10 picoseconds, or a counting rate of 100 GHz. Eliminating the logic gates also reduces the device count, which greatly enhances reliability and reduces power consumption and cost.

From the foregoing, it will be appreciated that the present invention represents a significant advance in the field of superconducting analog-to-digital converters. Although several preferred embodiments of the invention have been shown and described, it will be apparent that other adaptations and modifications can be made without departing from the spirit and scope of the invention. Accordingly, the invention is not to be limited, except as by the following claims.

I claim:

1. A superconducting counting analog-to-digital converter, comprising:
   a superconducting quantum interference device (SQUID) quantizer;
   means for applying a varying analog signal to the SQUID quantizer; and
   a bidirectional binary counter having a plurality of stages of floating four-junction SQUID flip-flops connected together in a cascade arrangement from the least significant bit (LSB) to the most significant bit (MSB);
   wherein the quantizer generates up-count and down-count voltage pulses for increasing and decreasing values of the analog signal and the bidirectional binary counter algebraically counts the voltage pulses, increasing the binary count when up-count pulses are received and decreasing the binary count when down-count pulses are received.

2. The superconducting counting analog-to-digital converter as set forth in claim 1, wherein each floating four-junction SQUID flip-flop includes:
   first, second, third and fourth Josephson junctions;
   first and second center-tapped inductances; and
   means for supplying a constant ungrounded gate current to the four-junction SQUID flip-flops;
   wherein each four-junction SQUID flip-flop is a bistable logic circuit in which the direction of the circulating current determines the state of the circuit;
   and wherein an up-count pulse will ripple from flip-flop to flip-flop, changing the binary state of each stage and generating a carry pulse if the initial state of the stage is a "1", and a down-count pulse will ripple from flip-flop to flip-flop, changing the binary state of each stage and generating a borrow pulse if the initial state of the stage is a "0".

3. The superconducting counting analog-to-digital converter as set forth in claim 2, wherein one terminal of each of the first and second Josephson junctions is connected to a different end terminal of the first inductance and one terminal of each of the third and fourth Josephson junctions is connected to a different end terminal of the second inductance;
   and wherein the other terminals of the first and third Josephson junctions are connected together and the other terminals of the second and fourth Josephson junctions are connected together;
   and wherein the gate current is injected into each SQUID flip-flop at the terminal between the first and third Josephson junctions.

4. The superconducting counting analog-to-digital converter as set forth in claim 3, wherein the center-tap terminal of the first inductance receives the carry pulse from the preceding four-junction SQUID flip-flop, or the up-count pulse from the quantizer if the four-junction SQUID flip-flop is the LSB flip-flop, and the center-tap terminal of the second inductance receives the borrow pulse from the preceding four-junction SQUID flip-flop, or the down-count pulse from the quantizer if the four-junction SQUID flip-flop is the LSB flip-flop;
   and wherein the carry pulse is output to the succeeding four-junction SQUID flip-flop from the terminal between the first inductance and the second Josephson junction and the borrow pulse is output to the succeeding four-junction SQUID flip-flop from the terminal between the second inductance and the fourth Josephson junction.

5. The superconducting counting analog-to-digital converter as set forth in claim 2, wherein when a four-junction SQUID flip-flop is indicating a "0", an up-count or carry pulse causes the third Josephson junction to pulse and a down-count or borrow pulse causes the fourth Josephson junction to pulse and output a borrow pulse to the succeeding SQUID flip-flop;
   and wherein when a SQUID flip-flop is indicating a "1", an up-count or carry pulse causes the second Josephson junction to pulse and output a carry pulse to the succeeding SQUID flip-flop and a down-count or borrow pulse causes the first Josephson junction to pulse.

6. The superconducting counting analog-to-digital converter as set forth in claim 2, and further including shunt resistors connected across the terminals of each Josephson junction, wherein each four-junction SQUID flip-flop operates in a nonlatching mode.

7. The superconducting counting analog-to-digital converter as set forth in claim 2, and further including means for inducing a flux bias current in each SQUID flip-flop.

8. The superconducting counting analog-to-digital converter as set forth in claim 1, wherein the quantizer is a double-junction SQUID quantizer including:
   first and second Josephson junctions;
   a center-tapped inductance; and
   means for supplying a constant gate current to the center-tap terminal of the inductance;
   wherein positive incremental changes in the analog current result in the generation of up-count voltage pulses across the first Josephson junction and negative incremental changes in the analog current result in the generation of down-count voltage pulses of the same polarity across the second Josephson junction.

9. The superconducting counting analog-to-digital converter as set forth in claim 1, wherein the quantizer is a single-junction SQUID quantizer including:
   a Josephson junction; and
   an inductance;
   wherein a positive analog voltage results in the generation of up-count voltage pulses across the Josephson junction and a negative analog voltage results in the generation of down-count voltage pulses of the opposite polarity across the Josephson junction.

10. A superconducting bidirectional binary counter for counting up-count and down-count voltage pulses, comprising:
   a plurality of stages of floating four-junction superconducting quantum interference device (SQUID) flip-flops connected together in a cascade arrangement from the least significant bit (LSB) to the most significant bit (MSB);
   wherein the bidirectional binary counter algebraically counts the up-count and down-count voltage pulses, increasing the binary count when up-count pulses are received and decreasing the binary count when down-count pulses are received.

11. The superconducting bidirectional binary counter as set forth in claim 10, wherein each floating four-junction SQUID flip-flop includes:
   first, second, third and fourth Josephson junctions;
   first and second center-tapped inductances; and
   means for supplying a constant ungrounded gate current to the four-junction SQUID flip-flops;
   wherein each four-junction SQUID flip-flop is a bistable logic circuit in which the direction of the circulating current determines the state of the circuit;
   and wherein an up-count pulse will ripple from flip-flop to flip-flop, changing the binary state of each stage and generating a carry pulse if the initial state of the stage is a "1", and a down-count pulse will ripple from flip-flop to flip-flop, changing the binary state of each stage and generating a borrow pulse if the initial state of the stage is a "0".

12. The superconducting bidirectional binary counter as set forth in claim 11, wherein one terminal of each of the first and second Josephson junctions is connected to a different end terminal of the first inductance and one terminal of each of the third and fourth Josephson junctions is connected to a different end terminal of the second inductance;
   and wherein the other terminals of the first and third Josephson junctions are connected together and the other terminals of the second and fourth Josephson junctions are connected together;
   and wherein the gate current is injected into each SQUID flip-flop at the terminal between the first and third Josephson junctions.

13. The superconducting bidirectional binary counter as set forth in claim 12, wherein the center-tap terminal of the first inductance receives the carry pulse from the preceding four-junction SQUID flip-flop, or the up-count pulse if the four-junction SQUID flip-flop is the LSB flip-flop, and the center-tap terminal of the second inductance receives the borrow pulse from the preceding four-junction SQUID flip-flop, or the down-count pulse if the four-junction SQUID flip-flop is the LSB flip-flop;
   and wherein the carry pulse is output to the succeeding four-junction SQUID flip-flop from the terminal between the first inductance and the second Josephson junction and the borrow pulse is output to the succeeding four-junction SQUID flip-flop from the terminal between the second inductance and the fourth Josephson junction.

14. The superconducting bidirectional binary counter as set forth in claim 11, wherein when a four-junction SQUID flip-flop is indicating a "0", an up-count or carry pulse causes the third Josephson junction to pulse and a down-count or borrow pulse causes the fourth Josephson junction to pulse and output a borrow pulse to the succeeding SQUID flip-flop;
   and wherein when a SQUID flip-flop is indicating a "1", an up-count or carry pulse causes the second Josephson junction to pulse and output a carry pulse to the succeeding SQUID flip-flop and a down-count or borrow pulse causes the first Josephson junction to pulse.

15. The superconducting bidirectional binary counter as set forth in claim 11, and further including shunt resistors connected the terminals of each Josephson junction, wherein each four-junction SQUID flip-flop operates in a nonlatching mode.

16. The superconducting bidirectional binary counter as set forth in claim 11, and further including means for inducing a flux bias current in each SQUID flip-flop.

17. A superconducting counting analog-to-digital converter, comprising:
   a toggling superconducting quantum interference device (SQUID) quantizer;
   means for applying a varying analog signal to the SQUID quantizer; and
   first and second binary counters;
   wherein the quantizer generates up-count and down-count voltage pulses for increasing and decreasing values of the analog signal and the binary counters algebraically count the voltage pulses, increasing the binary count when up-count pulses are received and decreasing the binary count when down-count pulses are received;
   and wherein the quantizer toggles between the two counters at the end of each sampling interval so that one counter can be read while the other counter is counting.

18. The superconducting counting analog-to-digital converter as set forth in claim 17, wherein the toggling quantizer includes:

first, second, third and fourth Josephson junctions;
first and second center-tapped inductances;
two resistors connected in series between the center-tap terminals of the two inductances; and
means for injecting a constant gate current into the terminal between the two resistors;
wherein the first counter is selected for counting by grounding the terminal between the first and third Josephson junctions and the second counter is selected for counting by grounding the terminal between the second and fourth Josephson junctions;
and wherein when the first counter is selected for counting, positive incremental changes in the analog signal result in the generation of up-count voltage pulses across the first Josephson junction and negative incremental changes result in the generation of down-count voltage pulses across the third Josephson junction, and when the second counter is selected for counting, positive incremental changes in the analog signal result in the generation of up-count voltage pulses across the second Josephson junction and negative incremental changes result in the generation of down-count voltage pulses across the fourth Josephson junction.

19. A toggling superconducting quantum interference (SQUID) quantizer, comprising:
a two-branch SQUID quantizer; and
means for toggling between the two branches.

20. A toggling superconducting quantum interference (SQUID) quantizer for toggling between first and second binary counters, comprising:
first, second, third and fourth Josephson junctions;
first and second center-tapped inductances;
two resistors connected in series between the center-tap terminals of the two inductances;
means for injecting a constant gate current into the terminal between the two resistors; and
means for applying a varying analog signal to the quantizer;
wherein the first counter is selected for counting by grounding the terminal between the first and third Josephson junctions and the second counter is selected for counting by grounding the terminal between the second and fourth Josephson junctions;
and wherein when the first counter is selected for counting, positive incremental changes in the analog signal result in the generation of up-count voltage pulses across the first Josephson junction and negative incremental changes result in the generation of down-count voltage pulses across the third Josephson junction, and when the second counter is selected for counting, positive incremental changes in the analog signal result in the generation of up-count voltage pulses across the second Josephson junction and negative incremental changes result in the generation of down-count voltage pulses across the fourth Josephson junction.

21. A superconducting counting analog-to-digital converter, comprising:
a variable-hysteresis superconducting quantum interference device (SQUID) quantizer;
means for applying a varying analog signal to the SQUID quantizer; and
a binary counter;
wherein the quantizer generates up-count and down-count voltage pulses for increasing and decreasing values of the analog signal and the binary counter algebraically counts the voltage pulses, increasing the binary count when up-count pulses are received and decreasing the binary count when down-count pulses are received;
and wherein the hysteresis of the quantizer is controlled, a small hysteresis allowing the quantizer to output the up-count and down-count pulses to the binary counter and a large hysteresis inhibiting the generation of the voltage pulses, thus providing a read period for the counter.

22. The superconducting counting analog-to-digital converter as set forth in claim 21, wherein the variable-hysteresis quantizer includes:
first and second Josephson junctions;
a center-tapped inductance; and
means for supplying a variable gate current to the quantizer;
wherein the hysteresis of the quantizer is controlled by the gate current.

23. A variable-hysteresis superconducting quantum interference device (SQUID) quantizer, comprising:
a SQUID quantizer; and
means for varying the hysteresis of the SQUID quantizer;
wherein a small hysteresis allows the quantizer to generate up-count and down-count voltage pulses and a large hysteresis inhibits the generation of voltage pulses.

24. A superconducting quantum interference device (SQUID) quantizer for use with a binary counter, comprising:
first and second Josephson junctions;
a center-tapped inductance;
means for supplying a variable gate current to the quantizer; and
means for applying a varying analog signal to the quantizer;
wherein the hysteresis of the quantizer is controlled by the gate current, a small gate current producing a large hysteresis and a large gate current producing a small hysteresis;
and wherein the quantizer generates up-count and down-count voltage pulses for increasing and decreasing values of the analog signal, a small hysteresis allowing the quantizer to output the up-count and down-count pulses to the binary counter and a large hysteresis inhibiting the generation of voltage pulses, thus providing a read period for the counter.

* * * * *